MANUFACTURING PROCESS FOR ELECTRONIC CAPACITORS

Filed Aug. 28, 1964 4 Sheets-Sheet 1

WITNESSES

Theodore F. Wrobel

Edward F. Possessky

INVENTOR

Emil J. Raue

BY F. P. Lyle

ATTORNEY

MANUFACTURING PROCESS FOR ELECTRONIC CAPACITORS

Filed Aug. 28, 1964 4 Sheets-Sheet 3

United States Patent Office 3,305,914

Patented Feb. 28, 1967

3,305,914

MANUFACTURING PROCESS FOR ELECTRONIC CAPACITORS

Emil J. Raue, Monroeville, Pa., assignor to Westinghouse Electric Corporation, Pittsburgh, Pa., a corporation of Pennsylvania Filed Aug. 28, 1964, Ser. No. 392,732
8 Claims. (Cl. 29—25.42)

The present invention relates to processes for producing electronic capacitors and more particularly to processes for producing glass dielectric capacitors having highly stable electrical characteristics and having utility in electronic circuits operating with frequencies up to 1000 megacycles.

In the manufacture of electronic capacitors as in the manufacture of other circuit components, it is desirable that the process steps employed be so characterized and so organized as to facilitate automatic mass production consistently with the maintenance of quality control of the mechanical and electrical characteristics of the end product. This manufacturing goal is particularly applicable to electronic glass capacitors since these devices ordinarily must accurately meet specifications of electrical characteristics such as dielectric constant, temperature coefficient and interplate current leakage, yet, to be economically competitive even in special markets, should not be excessively costly to manufacture.

One basic approach to production of electronic capacitors is that in which capacitor plates are dipped in a dielectric or glass slip and then fired and suitably combined under predetermined pressure and temperature to form basic capacitor units. These units are then housed or encapsulated in a manner suitable for promoting long capacitor life in the intended application.

To obtain markedly improved efficiency and to achieve low cost and high quality mass production, there is provided in accordance with the principles of the present invention a process for manufacturing electronic capacitors comprising the steps or forming capacitor plate tabs on carrier foil or strip, preferably bending the tabs from the plane of the strip, coating or dipping the tabs in a dielectric and preferably glass slip, firing the tabs, redipping and refiring the tabs if desired, forming capacitor core assemblies from the strip tabs, and encapsulating the core assemblies to provide finished capacitor devices.

It is therefore an object of the invention to provide a novel process for low cost quality mass production of electronic or glass dielectric capacitors.

A further object of the invention is to provide a novel process readily adaptable to automatic production of electronic or glass dielectric capacitors.

An additional object of the invention is to provide a novel process for producing electronic capacitors wherein the capacitor plates are accurately formed on a sprocketed carrier strip so as to provide a basis for infinite capacitance adjustments and generally provide a basis for production line quality control.

It is another object of the invention to provide a novel process for producing electronic capacitors wherein one or more of the process steps is controllably variable to provide a basis for accurately producing differently valued end product capacitor devices.

It is a further object of the invention to provide a novel process for producing electronic capacitors wherein the capacitor plates are accurately formed on a sprocketed carrier strip and are bendable from the plane of the strip for efficient dielectric application thereto and wherein predetermined lengths of the carrier strip with coated capacitor plate tabs can be stacked together so as to provide an efficient subassembly from which a plurality of capacitor devices can be economically formed with efficent quality control.

These and other more detailed objects of the invention will become more apparent upon consideration of the following detailed description along with the attached drawings, in which.

Figures 4, 4A, 4B:
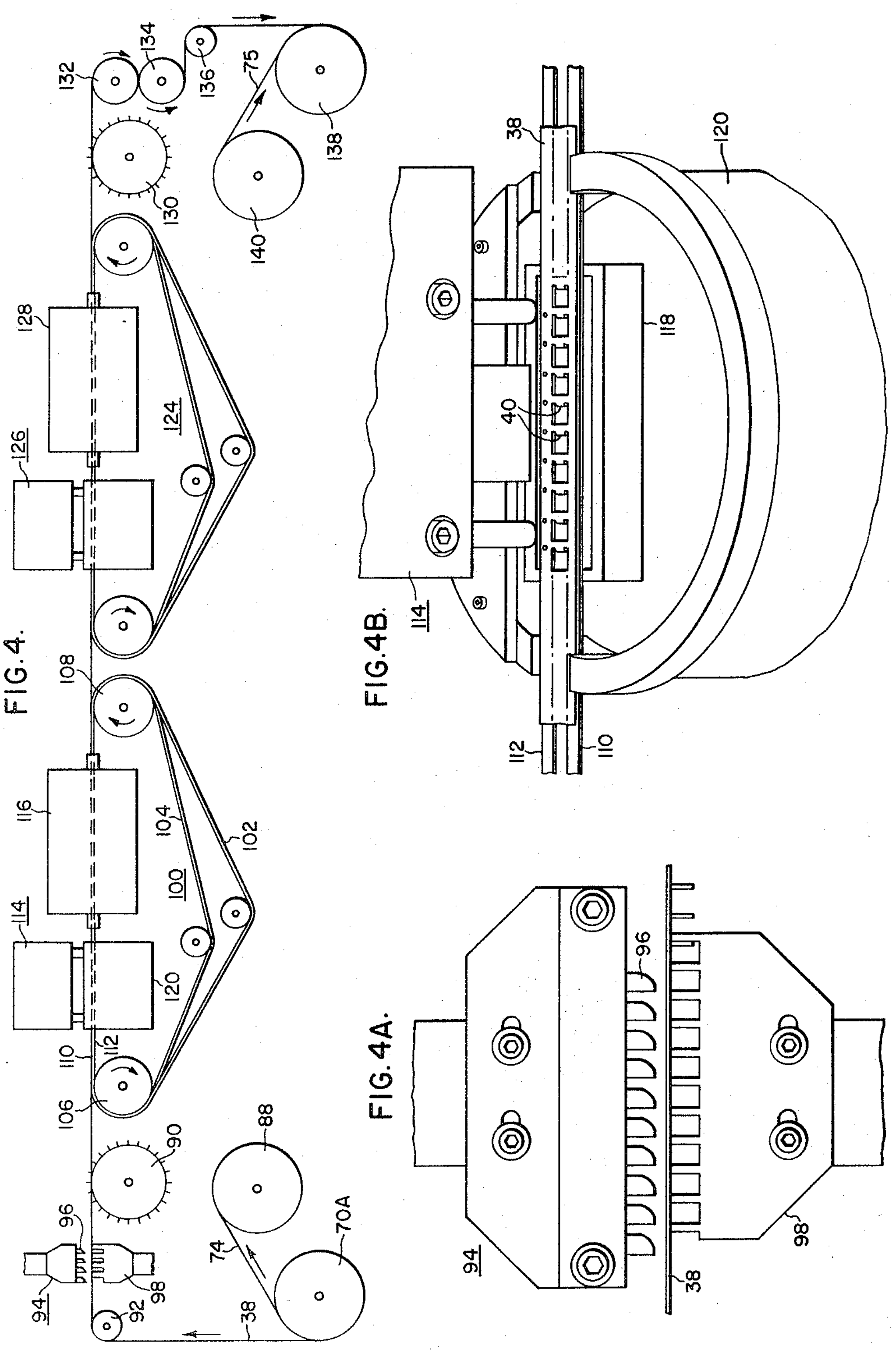
FIG. 4 shows a schematic view of apparatus employed in a tab glazing step of the manufacturing process.

FIGS. 4A and 4B respectively show enlarged views of bending and dipping devices employed in the apparatus of FIG. 4.

Figure 1:
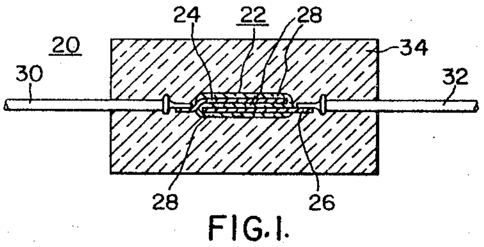
FIGURE 1 shows a longitudinal section of an electronic capacitor manufactured in accordance with the principles of the invention.
Figure 6:
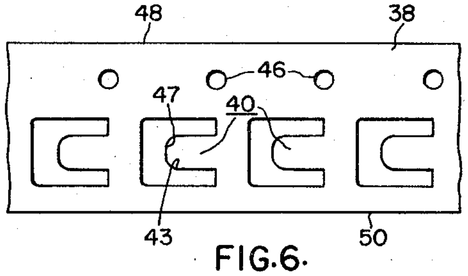
Figure 7:
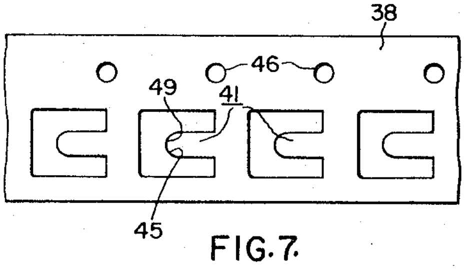
Figure 8:
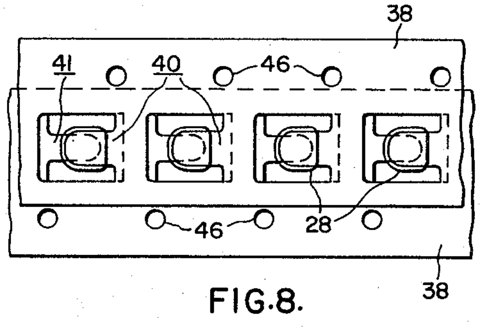
Figure 9:
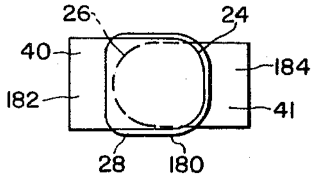
Figure 5:
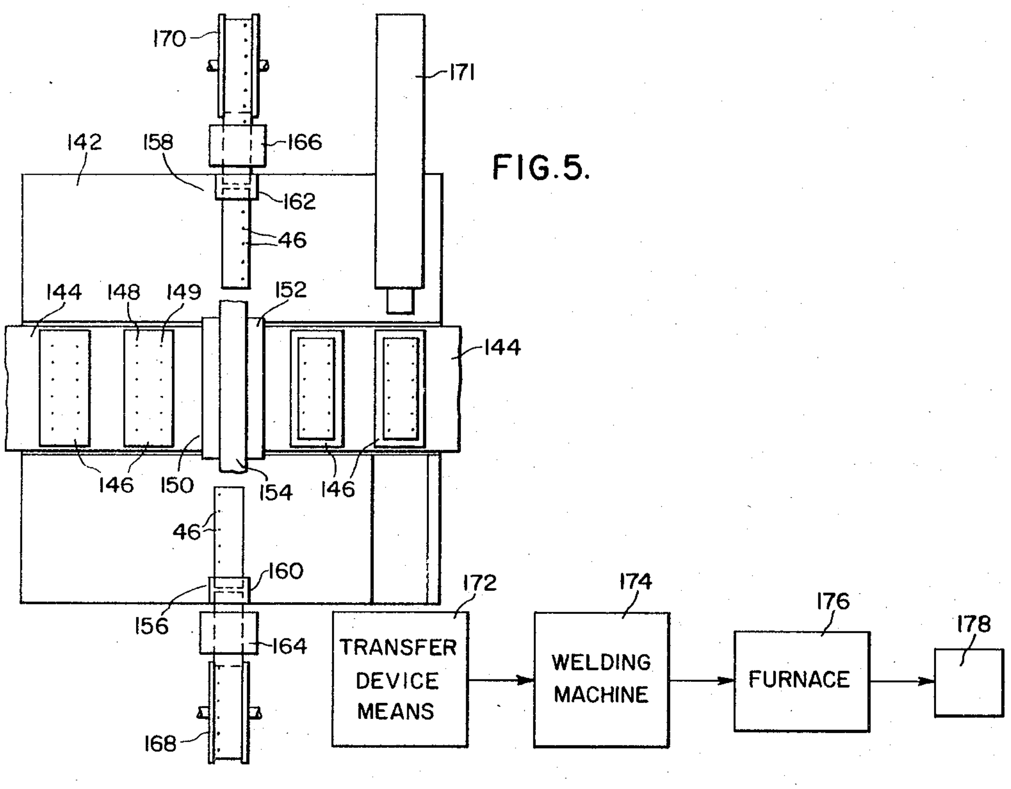
Figure 5A:
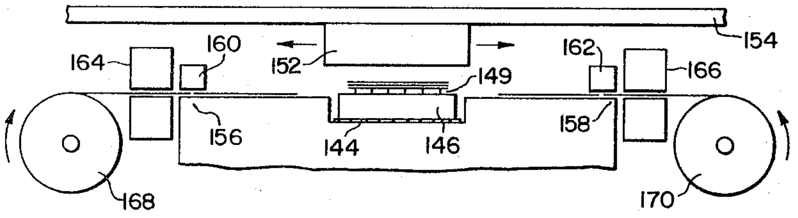
Figure 10:
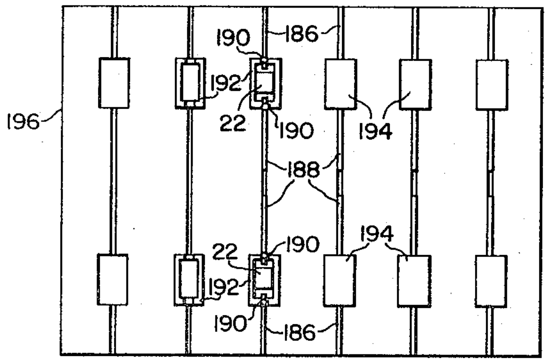

FIG. 5 shows a schematic view of apparatus employed in strip stacking and cutting, strip welding, and capacitor core fusing and assembly steps of the manufacturing process;

FIG. 5A shows a schematic end view of the apparatus of FIG. 5;

FIG. 6 shows a top view of a strip carrying capacitor plate tabs and cut to a predetermined length;

FIG. 7 shows a top view of a strip similar to the strip shown in FIG. 6 but having narrower capacitor plate tabs thereon;

FIG. 8 shows a top plan view of the strip lengths of FIG. 6 and FIG. 7 in stacked relation;

FIG. 9 shows a top view of a capacitor core assembly employed in the device of FIG. 1; and FIG. 10 shows a top plan view of a boat employed for loading capacitor casing halves about respective capacitor core assemblies all of which are fused together into finished capacitor devices as shown in FIG. 1.

More specifically, there is shown in FIG. 1 an electronic capacitor 20 manufactured in accordance with the process principles of the invention. The capacitor 20 comprises a capacitor core assembly 22 having at least two conductive plates 24 and 26 separated by dielectric material 28. However, a larger number of conductive plates 24 and 26 can be alternately stacked in relation to each other with dielectric material 28 disposed thereamong so that when all of the plates 24 are connected together electrically and all of the plates 26 are connected together electrically the desired end value of capacitance is obtained for the capacitor 20. Other plate connections can also be provided, for example several parallel combinations of the type just described can be electrically connected in series within the capacitor 20 if desired.

The dielectric material 28 which is disposed between the capacitor plates 24 and 26 is preferably glass and preferably is bonded to the confronting plate surfaces so as to provide mechanically and electrically stable integrated solid state character for the capacitor core assembly 22. The effective confronting plate area and the plate spacing produced by the dielectric material 28 as well as other factors such as the dielectric constant of the material 28 are determinative of the capacitance value associated with the plates 24 and 26 in the capacitor 20.

In order to provide for circuit connection, the capacitor 20 is provided with respective leads 30 and 32 attached to the capacitor plates 24 and 26 respectively and secured to and extended through casing 34 to the exterior of the device 20. The casing 34 is preferably suitably formed from glass so that the capacitor 20 can operate effectively at frequencies up to 1000 megacycles or more.

That is, since at such frequencies the casing 34 itself has effect on circuit operation of the capacitor 20, it is preferred that in high frequency applications the casing 34 be formed from glass with predetermined physical properties and characteristics such as an absence of voids or air pockets.

Figure 2:
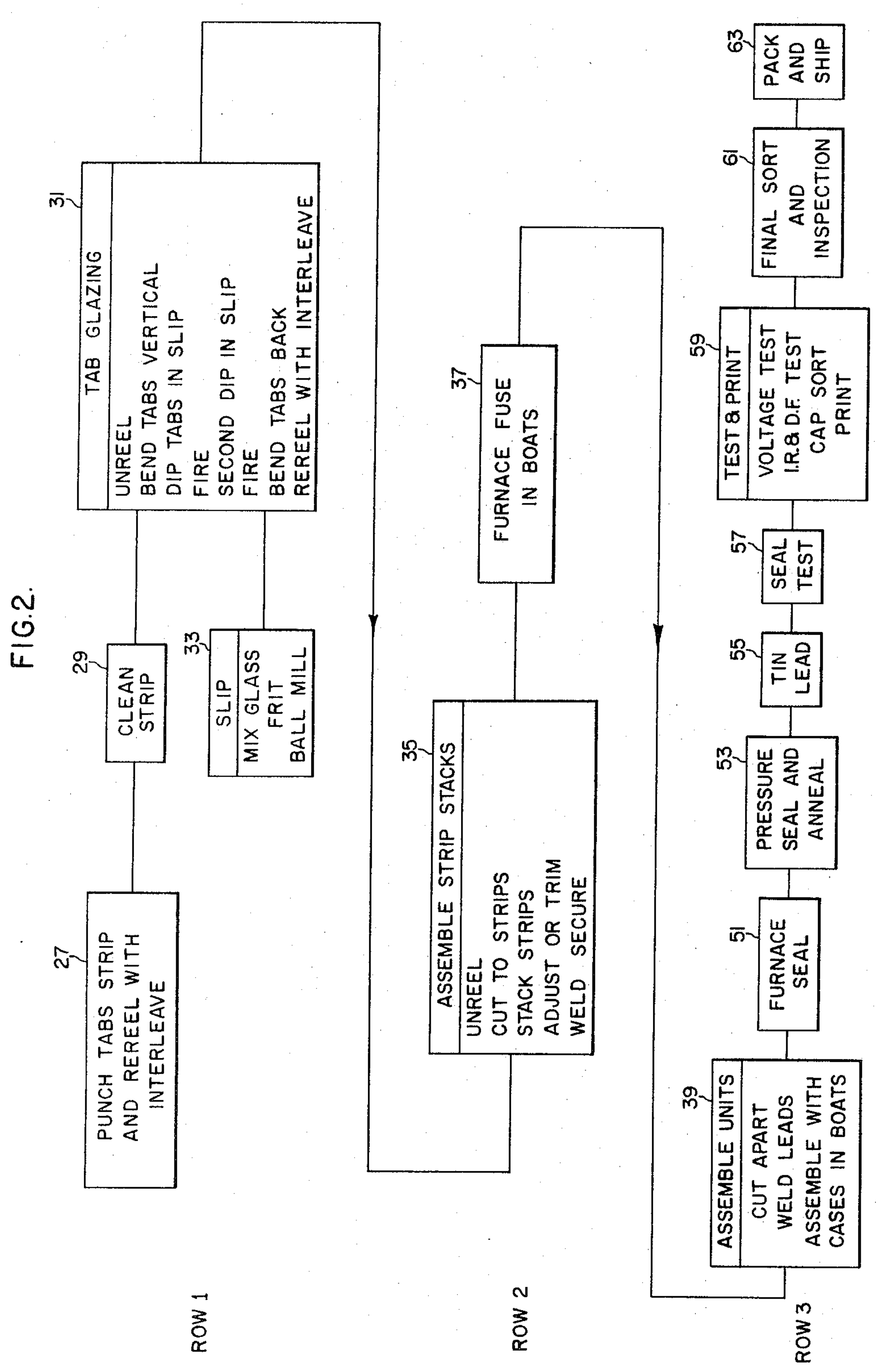
FIG. 2 shows a manufacturing flow chart mapping the movement of materials in accordance with the process principles of the invention.

Before presenting the process principles of the invention in detail, a general overview of the process can be obtained by reference to FIG. 2 where an overall capacitor manufacturing flow chart is shown. As indicated by separate block diagram rows, the process can be divided into three categories, namely, a first in which manufacturing materials can be processed with continuous flow, a second in which multi-unit assemblies are formed and a third in which individual capacitor core units are formed and processed into finished capacitor devices.

In the continuous flow category, a strip material is first punched as indicated by the reference character 27 to produce capacitor plate tabs, and the punched strip material is then cleaned as indicated by the reference character 29. In a tab glazing step as indicated by the reference character 31, the punched and cleaned strip material is unreeled for tab bending, dipping and firing (and redipping and refiring if desired), and the tabs are then rebent into the strip material for rereeling of the tab glazed stripping. Slip material, preferably glass, in a suitable vehicle is continuously provided as indicated by the reference character 33 for the tab dipping step in the tab glazing operation.

The tab glazed stripping is then assembled into strip stacks as indicated by the reference character 35 by means of strip cutting, stacking and welding steps. The stacked and welded strips are then fused in a suitable furnace as indicated by the reference character 37.

In the final stages of the manufacturing process, the fused strip stacks are formed into capacitor core units 22 as indicated by the reference character 39 by means of cutting and lead welding operations. The resulting capacitor core units 22 are assembled with casing halves in boats which are delivered to a furnace for sealing as indicated by the reference character 51.

Following the sealing operation, the capacitor devices 20 are pressure sealed as indicated by the reference character 53 for the purpose of reducing air pockets and the like which may remain within the material volume of the devices 20. The device leads 30 in FIG. 2 are then soldered or tinned as indicated by the reference character 55 and seal testing is then performed on each individual device 20 by suitable means as indicated by the reference character 57. Finally, each device 20 is tested for various characteristics as indicated by the reference character 59, and various information such as capacitance value can then be printed on the device casing 34. Final sorting and inspection for mechanical defects and packing is then provided as indicated by the reference characters 61 and 63.

Figure 3:
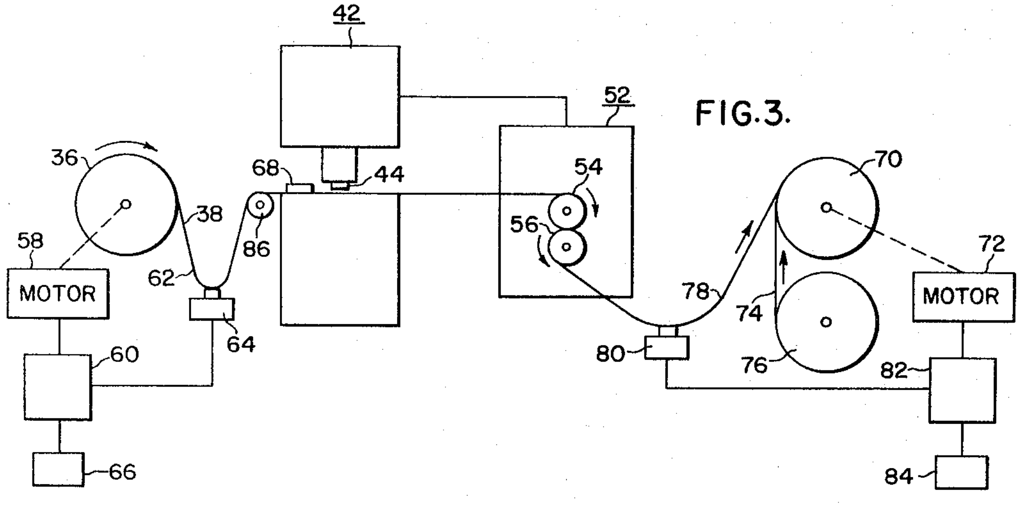
FIG. 3 shows a schematic view of apparatus employed in a strip punching step of the manufacturing process.

Apparatus that can be employed in the punching operation is shown in FIG. 3. This apparatus includes a feed reel 36 of conductive strip material 38, preferably aluminum strip which is relatively thin (say one-quarter mil to three mils thick) so as to provide for minimal physical volume in the end product, and sufficiently wide to act as a carrier for capacitor plate tabs 40 shown in FIG. 6. A punch press 42, preferably high speed, has a die 44 which is repeatedly driven up and down to punch the strip 38 in forming the tabs 40 and sprocket holes 46 (FIG. 6).

The rate at which the strip 38 moves through the punch press 42 and the rate at which the die 44 punches the strip 38 is preferably accurately controlled so that the holes 46 and the tabs 40 are located with predetermined spacing along the length of the strip 38 within a tolerance limit of one-fifth mil or better. Thus, in most production applications, the accuracy of the punching operation is a substantial determinant of the overall quality control achieved in using the process of the invention. This will become more apparent as the balance of the process is described in greater detail.

As shown in FIG. 6, the tabs 40 preferably extend along the longitudinal dimension of the strip 38 and are formed in the punching operation by a generally U-shaped cut within side edges 48 and 50 of the strip 38. The sprocket holes 46 are generally circular and are spaced from each other in aligned relation along the length of the strip 38 in proximity to the strip edge 48. The designer may prefer other orientations or shapes or locations for the tabs 40 or other arrangements or shapes or numbers or relative locations for the sprocket holes 46, and, if so, such modifications can be made within the spirit of the invention.

The punching press 42 is suitably controlled in its operation by means of a roller gear drive 52 which is provided with a drum 54 and a pressure back-up roll 56 for indexing the strip 38 in position for successive punching operations. Preferably, the punch control and strip indexing functions are provided such that the die 44 is raised through an upstroke as the drum 54 advances the strip 38 from the feed reel 36 by friction drive. As soon as the strip 38 has advanced into a position where it is indexed for the next punching operation, the drum 54 is stopped momentarily and the die 44 is rapidly dropped through a downstroke to make the next punching and immediately begins to be raised through an upstroke so as to allow strip indexing for the next punching operation.

The punching process step preferably is carried out at high speed, say 500 to 800 punchings per minute, so as to lend itself to volume mass production. Simultaneously, however, because of the need for quality control and because of the role that punching accuracy plays in achieving quality production as previously described, it is important that all of the factors which affect punching accuracy be closely controlled. This is especially true of the tensile pulling force on the strip 38 if the strip 38 is provided with a thickness of several mils or less. Strip or foil with such thickness is extremely frail or at best readily stretchable and accordingly normally should be pulled only with tensile force nominally sufficient for indexing the strip 38 in the manner described so as to not stretch or break the strip 38 in the punching step.

To control the tensile force on the strip 38 as it is pulled through the punching press 42, the feed reel 36 is preferably driven by motor 58 which is driven at controlled speed by suitable means 60 so as to maintain a "free" loop 62 of the strip 38 between the feed reel 36 and the punching press 42. One control scheme is shown as an illustration, and it is predicated on the operation of a suitable proximity switch 64 which actuates the control means 60 when the loop bottom drops to the switch 64 so as to actuate a timer 66 and simultaneously begin driving the motor 58 at a predetermined undercritical speed. The bottom of the strip loop 62 then slowly rises and after a preset time period and while the loop 62 still is hanging freely, the timer 66 actuates the control means 60 so as to begin driving the motor 58 and the feed reel 36 at a slightly overcritical speed. The bottom of the strip loop 62 then begins to drop and the feed speed of the reel 36 continues to cycle as described so that the loop 62 continuously hangs freely during the operation of the punching press 42.

For strip guidance and for desired strip tension, a slight weight 68 of suitable form can be placed over the strip 38 and suitably held in place at the input of the punching press 42. The total tension on the strip 38 as it is pulled through the press 42 depends primarily on the weight 68 and on the pulling force of the drum wheel 54. To minimize accelerating and decelerating forces by the wheel 48 on the strip 38 as the strip 38 is pulled, stopped, punched and repulled, the roller gear drive 52 preferably has a speed-time characteristic known in the art as a "modified trapezoidal characteristic."

A take-up reel 70, which is driven by motor 72, is provided for winding the punched strip 38 as it leaves the drum 54. Interleaving 74 of suitably smooth material is preferably concurrently wound on the take-up reel 70 from reel 76 so as to prevent entanglement between the tabs 40 of successive layers of strip 38 on the reel 70. A "free" loop 78 of the strip 38 is maintained between the drum 54 and the take-up reel 70 so as to prevent pulling force on the strip 38 from affecting the upstream pull provided by the drum 54. The loop 78 is maintained in the manner described for the loop 62, namely by means of a proximity switch 80, control means 82 and a timer 84 which cooperates to control the speed of the motor 72 and the take-up reel 70. At various points throughout the apparatus of FIG. 3, roller guides 86 can be provided for the strip 38 as desired.

The die 44 can of course be replaced by substitute dies from feed reel to feed reel so as to provide for variation in the type of punching made in any given reel of the strip 38. For example, the tab width can be reduced as it is true of tabs 41 in FIG. 7. The purpose of tab width reduction will become more evident hereinafter. As another example, the tab spacing along the length of the strip 38 and the overall tab size can be varied according to the final capacitance desired for the manufactured electronic capacitor device 20. Other obvious variations can be made from feed reel to feed reel according to the manufacturer's needs.

In addition, different punchings or different tab formations can be formed on a single feed reel or strip 38 although normally there would be little need for such an approach. Thus, the strip 38 can be run through the same punching press two or more times with a die change being made between each run and with suitable control provided for longitudinally spaced punchings in the strip. On the other hand, two or more punching presses with different dies can be interrelated and suitably controlled so that the same results can be achieved by single strip run through the presses in series.

Once the punched strip 38 is fully wound on the take-up reel 70, it is transferred to a location where it is suitably transported through a bath (not shown) for chemical cleaning purposes. Any alkaline or other suitable bath well known in pertaining art can be employed. Preferably, the cleaning effect is such as to provide an improved strip surface which promotes mechanical interlocking or bonding of dielectric or glass with the tabs 40 or 41 and further also removes minute slivers, burrs or metallic particles adhering or attached to the strip 38. If desired, the chemical bath can also be used to etch the punched strip 38 to a smaller thickness but this use of the bath is preferable only if the desired final strip thickness is so small that it becomes necessary to provide a greater beginning thickness for the strip 38 in order to complete successfully the punching operation. After the chemical bath, the strip is preferably washed with deionized water so that the strip acquires a virtually surgical level of cleanliness which reduces the possibility of organic or inorganic contamination being introduced into the end product.

After cleaning, the strip 38 on the take-up reel 70 is subjected to the glazing process step by means of apparatus such as that shown in FIG. 4. Thus, the take-up reel 70 becomes feed reel 70A with which there is associated a reel 88 for taking up the interleaving 74 as the reel 70A is unwound. The punched strip 38 is driven by means of sprocket wheel 90 and is guided by means of rollers 92 to a station where a bender 94 periodically is operated so that suitably spaced and formed teeth 96 (FIG. 4A) thereof bend aligned tabs 40 or 41 of the strip 38 downwardly from the plane of the strip 38. The preferred bend angle is approximately 90° but other bend angles can be employed. The bender 94 has a support table 98 suitably formed for permitting the bending operation and for permitting the strip 38 to be transported from the bending station with the tabs 40 or 41 in the bent position produced by the teeth 96.

Once the bending substep has been completed, the strip 38 is advanced to band means 100 preferably formed from stainless steel or other similar material as a pair of spaced parallel bands 102 and 104 which support the strip 38 during dipping and firing. The carrier bands 102 and 104 are continuous elements and are suitably driven, as by friction drum wheels 106 and 108 such that the carrier strip 38 is supported by top band portions 110 and 112 and moved by friction drive (with some slippage) into a dipper 114 and furnace means 116 in order.

In the dipper 114, there is disposed a dielectric or preferably glass slip which is preferably maintained substantially homogeneous by mixing means so as to promote uniform dielectric application to the bent tabs 40 or 41. In addition to homogeneity, it is preferred for the same end reason that a predetermined proportion of glass to vehicle (such as water or alcohol) in the slip be maintained substantially constant with time. Such ambient factors as changing humidity can affect (in this parameter example through the agency of vehicle evaporation rate) the ratio of the components in the mix, and suitable means (not shown) can be provided substantially to achieve the desired proportion constancy.

The glass or vitreous material for the slip is suitably prepared such as by pre-mixing the preselected constituents and then fritting and ball milling the resulting mixture to desired fineness. The glass composition is preferably such as to provide the following physical and electrical properties for the dielectric material where the capacitor 20 is to be employed in commercial or military applications (such as in tuned circuits or oscillators) requiring stability of electrical characteristics under widely varying ambient and environmental conditions (such as in satellites, rockets, etc.):

(1) Good resistance to thermal shock (say from −55° C. to +125° C.)
(2) Good resistance to physical shock (say capacity to withstand ten to fifty or more times the force of the earth's gravity)
(3) Low water absorption rate
(4) Good resistance to chemical erosion
(5) Dielectric constant (say equal to 12) which has little or no variation over wide ambient temperature variations
(6) Productive of very low power factor as a capacitor dielectric material
(7) Productive of very high Q as a capacitor dielectric material
(8) Melting or fusing point slightly lower than the melting point of the material employed for the tabs 40 or 41.

When glass is employed, the preferred glass composition is that disclosed in copending application Serial No. 410,-910, filed by E. K. Davis on November 13, 1964, and assigned to the present assignee.

The glass deposition on the bent tabs 40 or 41 is produced by a boat 118 (FIG. 4B) which carries slip from tank 120 and which moves upwardly within the tank 120 each time the strip is advanced to index a new strip section for the dipping operation. The boat 118 is lifted to a predetermined point where the slip in the boat 118 covers say three-quarters of the height of the downwardly bent tabs 40 or 41 of the indexed strip section, and the boat 118 is then lowered.

Since the tabs 40 or 41 are bent downwardly, the rest of the indexed portion of the strip 38 is not subjected to dipping and a portion of each tab 40 or 41 is thus left uncovered for lead welding without the use of masking or stop print techniques. Further, horizontal strip movement can be employed as described while vertical dip is provided for the tabs 40 or 41. This is opposed to the case where the entire strip would be lifted vertically through a slip whereby unbent tabs would be coated but the rest of the strip would be coated as well. In any event, the latter or vertical strip lift step has little or no utility where the strip is so thin as to be unable to withstand the vertical strip lifting forces without tearing or stretching.

The viscosity of the slip and the rate at which dipping occurs are primary determinants of the extent to which and the manner in which slip is deposited on the bent tabs 40 or 41. Preferably, these and other factors are controlled so that the deposition is substantially uniform over the tab surfaces. It is noted that uniform deposition on the tab edges is promoted by rounded end portion 43 or 45 of each tab 40 or 41 since a single dip point is then provided as indicated by the reference character 47 or 49. Since the boat 118 is continually raised and lowered through the slip in the tank 120, homogeneity of the slip in the tank 120 is promoted by this movement. In addition, the boat 118 is preferably provided with a valve bottom (not shown) which allows the slip in the boat to be completely replaced by slip from the mix after each dipping operation.

After dipping, the strip 38 is transported by the band means 100 through the furnace means 116 where the glass dielectric is fired onto the tabs 40 or 41 under suitable temperature and firing conditions. As a result of firing, the slip residue or glass dielectric is formed into a glaze which is bonded or mechanically interlocked with the respective tabs 40 or 41.

After firing, the strip 38 is preferably transferred to second carrier band means 124 for redipping by dipper 126 and refiring in furnace means 128 in a manner substantially identical with the first glazing operation. From the furnace means 128, the strip 38 is driven by sprocket wheel 130 through rolls 132 and 134, which bend the tabs 40 or 41 back into the plane of the strip 38, and then across suitable guide rolls 136 onto take-up reel 138. Interleaving 75 is again preferably wound on the reel 138 with the strip 38 from reel 140 so as to prevent tab entanglement.

Throughout the entire glazing process step, strip movement is suitably controlled to provide the necessary coordination for timing the bending, dipping and firing substeps. The furnace means 116 and 128 are in this instance horizontal units which provide a horizontal channel for movement of the strip 38 therethrough. A suitable temperature profile is thus provided in the furnace means 116 or 128 such that in cooperation with the predetermined strip transport time through the furnace means 116 and 128 the desired glazing is achieved. In place of the furnace means 116 and 128, a furnace station can be provided such that a predetermined number of small furnace units can be moved vertically in unison for respectively firing individual tabs 40 or 41 on a section of the strip 38 indexed in the furnace station for the firing operation.

The tab glazed strip on the reel 138 is next delivered to apparatus such as that shown in FIG. 5 preferably for stacking incremental lengths of the strip in preparation for fusing together associated glass coated tabs 40 and 41 on the stacked incremental lengths of the strip 38. However, if desired the stacking can be done on a continuous basis without cutting at this stage of the process.

The apparatus comprises a support table 142 on which there is provided a conveyor belt 144 carrying stacking boats 146 which are provided with sprocket projections 148 and 149 for placement of cut incremental lengths of the strip 38. The stacking boats 146 are periodically delivered to a stacking station area 150 by the conveyor belt 144, and in the stacking area 150 a vacuum carrier head 152 is suspended on a rail 154 for movement transversely across the table 142. The vacuum head 152 can also be raised and lowered vertically to lift cut incremental lengths of the strip 38 from cutting station 156 or 158 and to deposit the lifted strips on a stacking boat 146 indexed in position in the stacking station 150.

The incremental lengths of the strip 38 are produced by respective cutters 160 and 162 after a predetermined length of the strip 138 has been transported into the cutting station 156 or 158 by strip feeding means 164 or 166 from strip reel 168 or 170. Preferably, one of the reels 168 or 170 is provided with a strip 38 having the tabs 40 and the other reel 170 or 168 is provided with a strip 38 having the tabs 41.

In operation, the vacuum head 152 lifts an incremental length of the strip 38 from the cutting station 156 and deposits it in the indexed boat 146 such that the strip sprocket holes 46 register with sprocket projections 148 on the stacking boat 146, and the vacuum head 152 then lifts a cut incremental length of the strip 138 from the cutting station 158 and deposits it on top of the first incremental strip length on the boat 146 with sprocket hole registration with the projections 149. The tabs 40 and 41 are then aligned with a common longitudinal reference line even though the boat projections 148 and 149 are spaced from each other by more than the strip width, because the tabs 40 and 41 respectively are offset from the associated strip centerline by a predetermined amount for this very purpose. This procedure continues until a predetermined count of incremental strip lengths have been alternately stacked on the indexed stacking boat 146.

The incremental lengths of the strip 38 are stacked such that alternate lengths have the longitudinally aligned tabs 40 and 41 extending in opposite directions. The uncoated ends of the tabs 40 and 41 accordingly project in opposite directions for lead attachment thereto. Further, by simply adjusting the extent to which the tabs 40 and 41 overlap (see FIG. 8), the effective capacitance plate area can be readily (and "infinitely") adjusted. The overlap adjustment can be realized by adjusting the relative setting of the sprocket projections 148 and 149 on the stacking boats 146. Thus, once the sprocket projections 148 and 149 are preset in relation to each other, successive layers of incremental lengths of the strip 38 have their tabs 40 and 41 automatically longitudinally overlapped by a predetermined amount.

The number of incremental lengths of the strip 38 which are stacked together can be varied according to the end capacitance desired for the capacitor devices 20. After the stacking operation has been completed, the conveyor belt 144 moves the stacking boat 146 outwardly from the stacking station 150 and the next stacking boat 146 is then indexed in position in the stacking station 150 for the next stacking operation.

As the stacked boats 146 are transported by the conveyor belt 144 to the end of the table 142, a suitable cylinder 172 or other device can be utilized to push the stacked boats 146 onto transfer device means 172. The transfer device means 172 then transports the stacked boats 146 to a welding machine 174 where the stacked incremental lengths of the strip 38 are spot or seam welded along their lengths so that the relative orientation of the strip tabs 40 and 41 are fixed in place for furnace fusing.

From the welding machine 174, the stacked and welded incremental lengths of strip 38 are preferably transferred to another carrier (not shown) such as a graphite or metallic tablet or plate or the like on which the stacked and welded strips are disposed with one of the flat sides down. A predetermined weight is then placed over the strips on the tablet with a predetermined spacing between the tablet and the weight. In this manner, an accurate dielectric thickness between the capacitor plate tabs 40 and 41 can be obtained from unit to unit of production. The tablet carriers are then transported through suitable furnace means 176 for the fusion process step. A suitable temperature profile is provided across the furnace means 176 to provide for dielectric fusion and annealing with the carrier transport through the furnace means 176 taking place over a predetermined time period.

After fusion, adjacent capacitor platetabs 40 and 41 are fused into a solid mass with the dielectric glass material 38 therebetween. Where three or more tabs 40 and 41 are fused into at common stack, it is preferred that the narrower tab or tabs 41 be intermediate to a pair of wider tabs 40 on opposite sides thereof for improved end product quality. The improved quality arises from the fact that the narrower tab 41 promotes dielectric or glass flow around the edges thereof and between the edges thereof and the edges of the wider tabs 40. A possibility of poor tab edge coverage by the dielectric and the associated possibility of capacitor rejection on dielectric voltage test is thus made more improbable.

Once fused, the stacked tabs 40 and 41 have a predetermined spacing therebetween through the dielectric material 28 and are suitably prepared for separation from the carrier strip 38. For this purpose, the stacked, welded and fused incremental lengths of strip 38 are taken through a suitably designed cutting machine 178 which successively cuts the fused tabs 40 and 41 from the incremental lengths of strip 38 to form sub-units as indicated by the reference character 180 in FIG. 9.

In the sub-unit 180, the strip tabs 40 and 41 are identified as the capacitor tab plates 24 and 26 previously described in connection with FIG. 1. The tab plates 24 and 26 are respectively provided with oppositely disposed end tab portions 182 and 184 to which leads 186 and 188 (FIG. 10) are welded or otherwise suitably secured to form the capacitor core assembly 22. Preferably, the leads 186 and 188 are cut to a predetermined length and are provided with a small glass bead 190 at a predetermined point along the length thereof.

As shown in FIG. 10, the capacitor core assemblies 22 are disposed in respective casing halves 192 on a graphite, metallic, or other suitable boat 196. Top casing halves 194 are then disposed over the bottom casing halves 192 to complete the sub-assembly of the various devices loaded on the boat 196. Predetermined pressure is then applied against the top halves 194 of the devices in the boat 196 as by a weight or the like similar to that previously described in connection with the tablet employed in the furnace means 176. In the special high frequency applications previously referred to, the casing halves 192 and 194 are preferably glass and can be the same material employed as the dielectric constituent of the slip or it can be a different glass composition.

The boat 196 is disposed in another furnace means (not shown) where device fusion is obtained under predetermined temperature and time conditions. The presence of the glass beads 190 on the leads 186 and 188 promotes sealing about the leads 186 and 188 and mechanical securance thereof to the casing 192, 194.

After device fusion, the capacitor core assembly 22 is tightly encapsulated and ready for final production processing. Although the described glass encapsulation is preferred especially for the special applications indicated, the encapsulation process step can be provided by other well known techniques with the various degrees of sealing associated therewith.

The sealed capacitor devices 20 can be left in the boats 196 or they can be transferred to other carriers for pressure sealing in which suitable inert gas pressure and temperature conditions are employed under precise timing of application substantially to remove voids and air pockets from the devices 20 and to anneal the devices 20. From the pressure sealing operation, the capacitor devices 20 are transferred for lead tinning or soldering operations or other operations as indicated by the block diagram 55, 57, 59, 61 and 63 in FIG. 2.

Capacitor devices manufactured in accordance with the process principles of the invention can have capacitance values ranging from say 0.5 picofarads to 1 microfarad. The power factor loss ($\Delta F$) can be as low as .0005% or less and the quality factor Q can be as high as 1500 or more and both of these factors can have relatively favorable values over wide temperature ranges. The variation in capacitance in parts per million can be as little as 150 plus or minus 15, and for all essential purpose the manufactured capacitance value for the electronic capacitor devices 20 can thus be fixed.

In the foregoing disclosure, several embodiments have been described only to illustrate the principles of the invention. Accordingly, it is desired that the invention be not limited by the embodiments described, but, rather, that it be accorded an interpretation consistent with the scope and spirit of its broad principles.

What is claimed is:

1. A process for manufacturing electronic capacitors, the steps of said process comprising forming a plurality of capacitor plate tabs on a strip of conductive material, bending said tabs from the plane of said strip, dipping said tabs in a dielectric glass slip, firing said tabs, redipping said tabs in dielectric glass slip, refiring said tabs, formng a plurality of capacitor core assemblies from at least respective pairs of said tabs, and encapsulating each of said capacitor core assemblies.

2. A process for manufacturing electronic capacitors, the steps of said process comprising punching a continuous strip of conductive material to form a plurality of longitudinally spaced capacitor plate tabs extending in the strip longitudinal direction, bending said tabs from the plane of said strip, dipping said tabs in a dielectric slip, stackng at least two predetermined lengths of said strip with respective pairs of associated tabs of said strip lengths in predetermined overlapping relation, fusing said associated tabs together under predetermined fusing and temperature and pressure conditions, forming a plurality of capacitor core assemblies from the respective fused tab pairs, and encapsulating each of said capacitor core assemblies.

3. A process for manufacturing electronic capacitors, the steps of said process comprising punching a continuous strip of conductive material to form a plurality of longitudinally spaced capacitor plate tabs extending in the longitudinal direction along a longitudinally extending reference line offset from the longitudinal center line of said strip and to form a plurality of sprocket holes spaced longitudinally from each other, bending said tabs from the plane of said strip, glazing said tabs with a glass dielectric, stacking at least two predetermined lengths of said strip with the respective sets of sprocket holes of said predetermined strip lengths indexed in spaced relation so that respective pairs of associated tabs of said strip lengths are disposed in predetermined overlapping relation, welding the predetermined strip lengths to fix the tabs in the predetermined overlapping relationship, fusing said associated tabs together under predetermined fusing temperature and pressure conditions, forming a plurality of capacitor core assemblies from at least respective pairs of said tabs, and encapsulating each of said capacitor core assemblies.

4. A process for manufacturing electronic capacitors as set forth in claim 3, wherein said glazing step comprises dipping said tabs in a dielectric glass slip, firing said tabs, redipping said tabs in a dielectric glass strip and refiring said tabs.

5. A process for manufacturing electronic capacitors as set forth in claim 4, wherein said steps also include maintaining the dielectric glass slip with substantial homogeniety and wtih a substantially constant proportion of vehicle to glass.

6. A process for manufacturing electronic capacitors, the steps of said process comprising punching a continuous strip of conductive material to form a plurality of longitudinally spaced capacitor plate tabs extending in the strip longitudinal direction, bending said tabs from the plane of said strip, dipping said tabs in a dielectric slip, so as to leave an uncoated portion on each of said tabs, stacking at least two predetermined lengths of said strip with respective pairs of associated tabs of said strip lengths in predetermined overlapping relation, fusing said associated tabs together under predetermined fusing and temperature and pressure conditions, cutting the associated and fused tab pairs from the stacked strip lengths, attaching oppositely disposed leads to said uncoated tab portions of each tab pair to form respective capacitor core assemblies, disposing each of said capacitor core assemblies in a glass casing half, enclosing each of said capacitor core assemblies with another glass casing half, and fusing the casing halves together so as to form encapsulated electronic capacitor devices.

7. A process for manufacturing electronic capacitors, the steps of said process comprising punching a continuous strip of conductive material to form a plurality of capacitor plate tabs extending in the strip longitudinal direction and to form a plurality of sprocket holes spaced longitudinally from each other, glazing said tabs with a glass dielectric, stacking at least two predetermined lengths of said strip, positioning said strip lengths by means of said sprocket holes such that respective pairs of associated tabs of said strip lengths are in predetermined overlapping relation, forming a plurality of capacitor core assemblies from at least respective pairs of said tabs, and encapsulating each of said capacitor core assemblies.

8. A process for manufacturing electronic capacitors, the steps of said process comprising punching a continuous strip of conductive material to form a plurality of capacitor plate tabs extending in the strip longitudinal direction and to form a plurality of sprocket holes spaced longitudinally from each other, glazing said tabs with a glass dielectric, stacking at least two predetermined lengths of said strip, positioning said strip lengths by means of said sprocket holes such that respective pairs of associated tabs of said strip lengths are in predetermined overlapping relation, welding said strip lengths together to fix the relative locations of said tabs, fusing said associated tabs together, forming a plurality of capacitor core assemblies from at least respective pairs of said tabs, and encapsulating each of said capacitor core assemblies.

References Cited by the Examiner

UNITED STATES PATENTS 2,059,783 11/1936 Farnworth.
2,238,031 4/1941 Brennan ............ 317—261
2,483,424 10/1949 Martines.
2,830,698 4/1958 Coda ............ 29—25.42 X JOHN F. CAMPBELL, *Primary Examiner.*

WILLIAM I. BROOKS, *Examiner.*